United States Patent
Lee

(10) Patent No.: US 7,597,109 B2
(45) Date of Patent: Oct. 6, 2009

(54) SPIN SCRUBBER APPARATUS

(75) Inventor: Hyun-Wook Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 610 days.

(21) Appl. No.: 11/360,417

(22) Filed: Feb. 24, 2006

(65) Prior Publication Data
US 2006/0231127 A1 Oct. 19, 2006

(30) Foreign Application Priority Data
Apr. 15, 2005 (KR) .................... 10-2005-0031328

(51) Int. Cl.
*B08B 3/02* (2006.01)
(52) U.S. Cl. .................. 134/140; 134/164; 134/902
(58) Field of Classification Search ................ 134/902, 134/140, 164
See application file for complete search history.

(56) References Cited

U.S. PATENT DOCUMENTS

| | | | | |
|---|---|---|---|---|
| 4,483,651 A | * | 11/1984 | Nakane et al. | 414/217 |
| 4,836,733 A | * | 6/1989 | Hertel et al. | 414/744.5 |
| 5,151,008 A | * | 9/1992 | Ishida et al. | 414/744.5 |
| 5,479,108 A | * | 12/1995 | Cheng | 324/765 |
| 5,695,564 A | * | 12/1997 | Imahashi | 118/719 |
| 5,788,447 A | * | 8/1998 | Yonemitsu et al. | 414/217 |
| 5,924,154 A | * | 7/1999 | Gockel et al. | 15/77 |
| 5,993,141 A | * | 11/1999 | Wytman | 414/744.2 |
| 6,062,798 A | * | 5/2000 | Muka | 414/416.03 |
| 6,110,011 A | | 8/2000 | Somekh et al. | |
| 6,336,054 B1 | * | 1/2002 | Ota et al. | 700/112 |
| 6,485,250 B2 | * | 11/2002 | Hofmeister | 414/744.1 |
| 6,616,394 B1 | * | 9/2003 | Park | 414/222.01 |
| 7,198,448 B2 | * | 4/2007 | Ozawa et al. | 414/217 |
| 2002/0006323 A1 | * | 1/2002 | Yoshida et al. | 414/217 |
| 2003/0123958 A1 | * | 7/2003 | Sieradzki et al. | 414/217 |
| 2004/0117059 A1 | * | 6/2004 | IIjima et al. | 700/213 |

* cited by examiner

*Primary Examiner*—Frankie L Stinson
(74) *Attorney, Agent, or Firm*—Volentine & Whitt, PLLC

(57) ABSTRACT

A spin scrubber apparatus has an index unit configured to support one or more cassettes, a processing unit having one or more cleaning stations facing the index unit across a transfer space, and a substrate transfer device disposed in the transfer space for transferring substrates one-by-one between the index unit and the processing unit. The transfer device includes a transfer block, and an index arm and a transfer arm unit supported by the transfer block. The transfer block is movable in the transfer space to position the index arm or the transfer arm unit in front of a cassette or a spin scrubber. The index arm loads/unloads substrates into/from a cassette mounted to the index unit. The transfer arm loads/unloads substrates into/from the processing unit. All of the movement takes place in the transfer space. Thus, the apparatus is compact, and it takes relatively little time to clean the substrates.

20 Claims, 11 Drawing Sheets

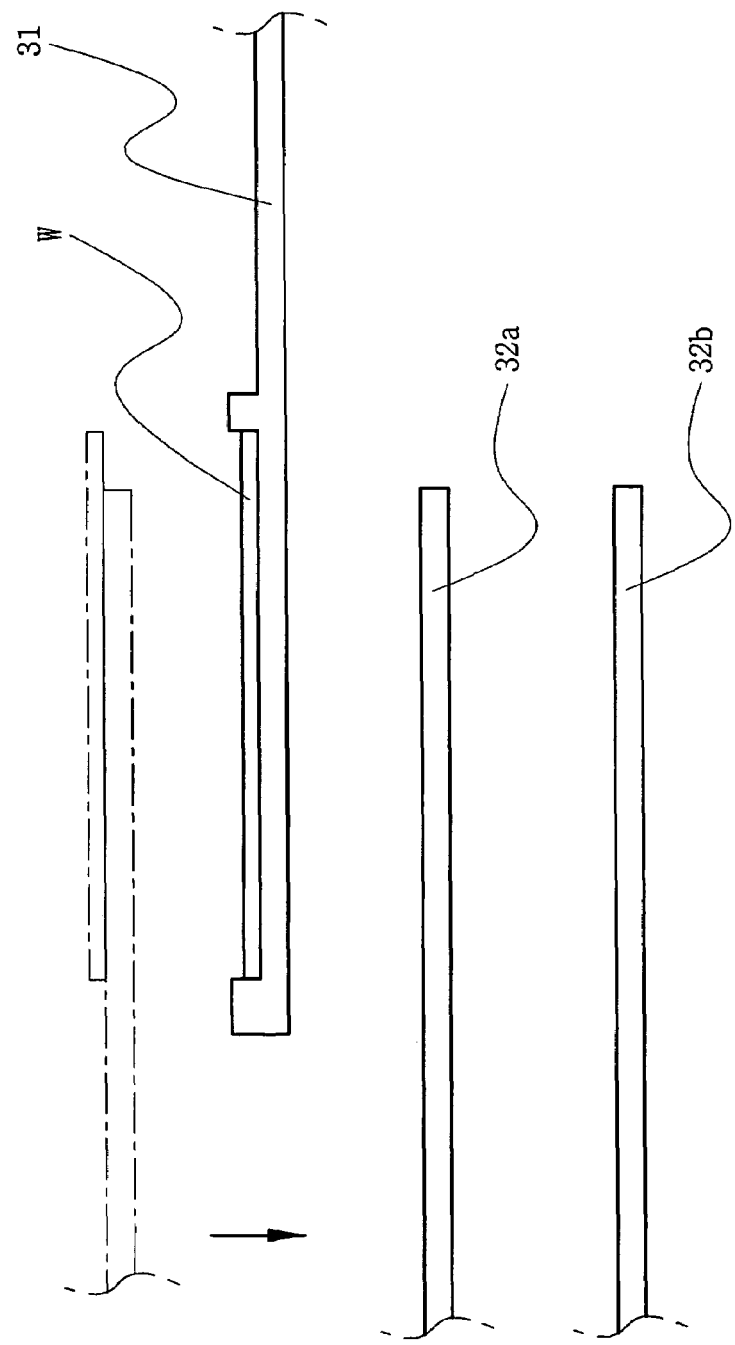

SPIN SCRUBBER APPARATUS

BACKGROUND OF THE INVENTION

1. Field of the Invention

The present invention relates to apparatus for cleaning substrates in the manufacturing of semiconductor devices, liquid crystal displays and the like. More particularly, the present invention relates to a spin scrubber of the type that cleans substrates one at a time to remove all sorts of foreign substances, such as particles, from a surface of the substrate.

2. Description of the Related Art

Semiconductor devices and liquid crystal displays are generally manufactured by performing various processes on substrates. A number of different contaminants adhere to the substrates as a result of these processes. Therefore, the substrates are cleaned several times throughout the course of the overall manufacturing process. Also, there is an ongoing demand for semiconductor devices having higher degrees of integration and greater reliability. Even minute contaminants affect the yield of products manufactured according to fine design rules to meet such demand. Therefore, the cleaning process is critical to the success of the manufacturing of high-end semiconductor devices and the like.

The apparatus for cleaning the substrates is typically a wet-type of apparatus that physically removes particles or impurities from a surface of a substrate. The wet-type of cleaning apparatus may be classified as batch type in which a plurality of substrates are cleaned at once in a cleaning solution, and a single wafer type in which substrates are cleaned one at a time.

A spin scrubber is a known single wafer type of cleaning apparatus in which a substrate is rotated as it is cleaned. FIG. 1 is a perspective view of a conventional spin scrubber apparatus. The spin scrubber apparatus includes an index unit 100, a first substrate-transferring portion 200, a second substrate-transferring portion 300, and a processing unit 400. The processing unit 400 includes a plurality of spin scrubbers which clean a substrate by rotating the substrate, and dispensing ultra pure water onto the rotating substrate to thereby physically remove contaminants from the surface of the substrate. The processing unit 400 may also employ a brush to assist in the scrubbing of the substrate.

A cassette 110 in which a number of substrates are stacked is mounted on the index unit 100. The first substrate-transferring portion 200 is capable of loading/unloading substrates into/from the cassette 110, and the second substrate-transferring portion 300 is capable of loading/unloading substrates into/from the spin scrubbers of the processing unit 400. The first substrate-transferring portion 200 includes an index arm 210 and the second substrate-transferring portion 300 includes a transfer arm unit 310. The index arm 210 and the transfer arm unit 310 transfer the substrates one-by-one from the index unit 100 to the processing unit 400 and vice versa until all of the substrates are cleaned.

To this end, the index arm 210 of the first substrate-transferring portion 200 of the spin scrubber apparatus and the transfer arm unit 310 of the second substrate-transferring portion 300 of the spin scrubber apparatus have working envelopes in which the index arm 210 and the transfer arm unit 310 move, respectively. These working envelopes are essentially discrete from one another; that is, the index arm 210 and the transfer arm unit 310 move along paths that extend in different directions.

In addition, the transfer arm unit 310 includes an upper arm and a lower arm. When the index arm 210 withdraws a substrate from the cassette 110, the lower arm of the transfer arm unit 310 receives the substrate from the index arm 210 and moves it to the processing unit 400. On the other hand, the upper arm of the transfer arm unit 310 withdraws substrates from the processing unit 400. Thus, a clean substrate withdrawn from the processing unit 400 by the upper arm of the transfer arm unit 310 is transferred to the index arm 210 and re-loaded into the cassette 110 by the index arm 210. These operations are carried out until the substrates in the cassette 110 are transferred from the cassette 110, cleaned and returned to the cassette 110 one-by-one.

However, the spin scrubber apparatus as described above is cumbersome because the working envelopes of the index arm 210 and the transfer arm unit 310 are basically discrete from one another. That is, the spin scrubber apparatus has a relatively large footprint. In addition, the path along which substrates are transferred between the cassette 110 and the processing unit 400 is long. Accordingly, it takes along time to clean all of the substrates in the cassette and return the cleaned substrates to the cassette. These drawbacks, namely the long processing time and large space requirements for the conventional spinner scrubber apparatus, increase the cost of manufacturing the semiconductor devices, liquid crystal displays and the like.

SUMMARY OF THE INVENTION

Therefore, an object of the present invention is to provide a spin scrubber apparatus in which the time required for transferring the substrates is minimal so that the productivity of the cleaning process is correspondingly high.

Another object of the present invention is to provide a spin scrubber apparatus that has a small footprint, i.e., that requires a small amount of installation space.

According to one aspect of the present invention, the spin scrubber apparatus provides a short transfer path.

The spin scrubber apparatus comprise an index unit and a processing unit facing each other across a transfer space, and a substrate-transferring device disposed in the transfer space. The index unit and/or the processing unit has a plurality of stations; the index unit has at least one loading/unloading station configured to support a cassette in which a plurality of substrates to be cleaned are stored, and the processing unit has at least one cleaning station at which a substrate is cleaned.

The substrate transfer device includes a transfer block, and an index arm and a transfer arm unit disposed on the transfer block. The transfer block is supported so as to be linearly movable in the transfer space in the direction of a first axis such that the transfer block can be positioned in front of each loading/unloading station of the index unit and each cleaning station of the processing unit. The index arm has a working envelope that encompasses the index unit whereby the index arm loads/unload substrates into/from cassettes mounted to the index unit. The transfer arm unit has a working envelope that encompasses the processing unit whereby the transfer arm unit loads/unloads substrates into/from the processing unit. The working envelopes of the index arm and the transfer arm unit also overlap in the transfer space such that substrates are transferred between the index arm and the transfer arm unit in the transfer space.

BRIEF DESCRIPTION OF THE DRAWINGS

The above and other objects, features and advantages of the present invention will become more apparent to those of ordinary skill in the art from the following detailed description of the preferred embodiments thereof made with reference to the attached drawings in which:

FIGS. 7 through 9 are side views of the transfer device of the spin scrubber apparatus according to the present invention, illustrating the transferring of a substrate by the index arm and the transfer arm unit of the transfer device.

DETAILED DESCRIPTION OF THE PREFERRED EMBODIMENTS

Figure 1:
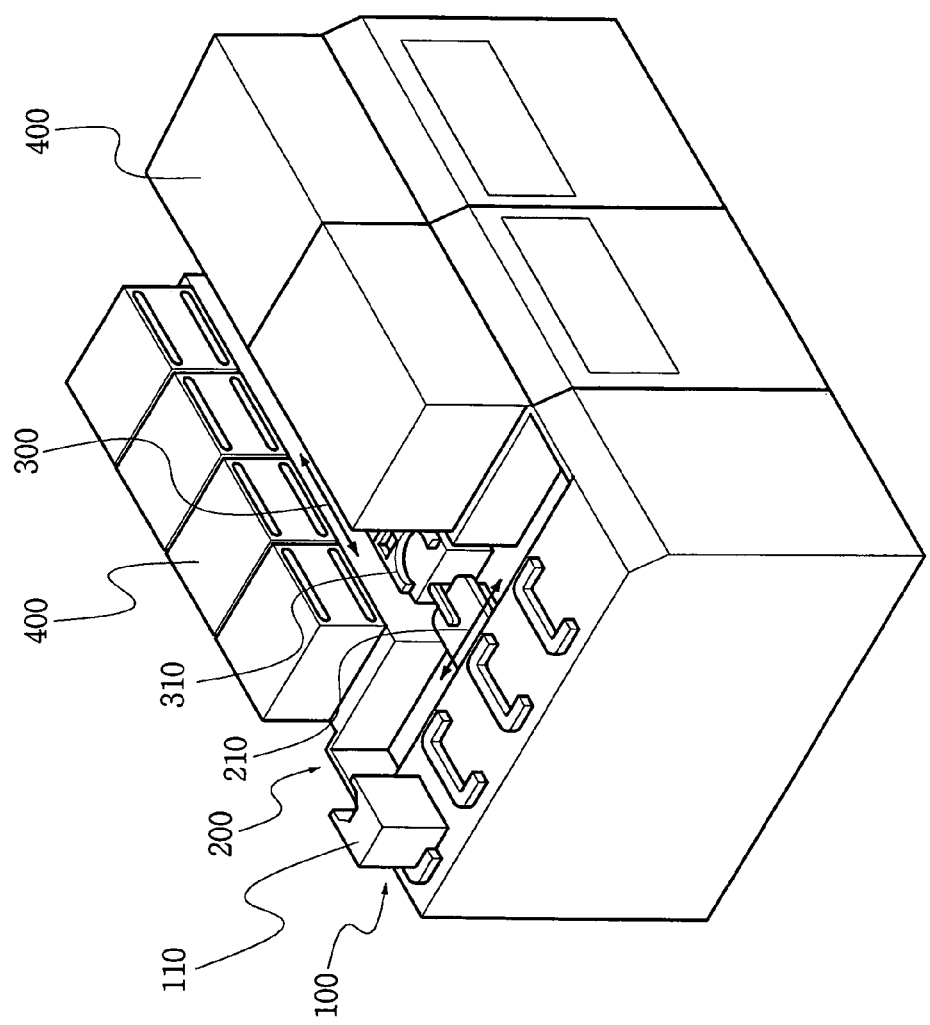
FIG. 1 is a perspective view of a conventional spin scrubber apparatus.
Figure 2:
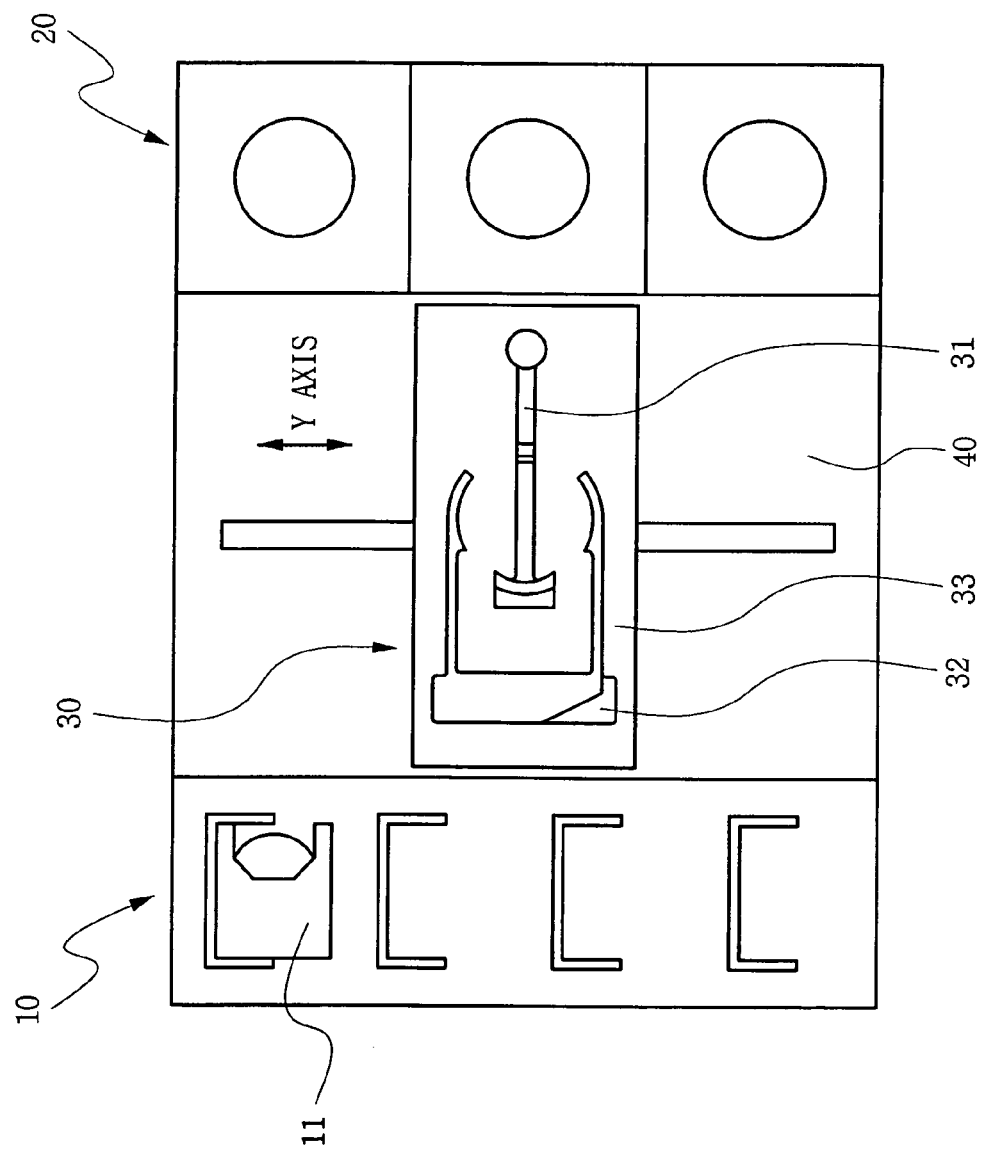
FIG. 2 is a plan view of a spin scrubber apparatus according to the present invention.

Referring first to FIG. 2, a spin scrubber apparatus according to the present invention comprises an index unit 10, a processing unit 20, and a transfer device 30. The index unit 10 may have several loading/unloading stations each structured to support a cassette 11 and fix the cassette upright on the index unit 10. The loading/unloading stations are arrayed in the direction of a Y-axis. Each cassette 11 is configured to support a plurality of substrates as vertically spaced one above the other. Preferably, the index unit 10 includes an elevating mechanism to move the cassette 11 up and down on. The substrates are withdrawn from the cassette 11 one-by-one, are cleaned by the processing unit 20, and are then loaded back into a cassette 11. The processing unit 20 and the index unit 10 face each other across a transfer space 40.

The processing unit 20 physically removes contaminants adhering to the substrate by rotating the substrate and injecting ultra pure water onto the surface of the rotating substrate. To this end, the processing unit 20 includes several cleaning stations. The cleaning stations are also arrayed in the direction of the y-axis. Each cleaning station includes a spin scrubber having a rotary chuck for holding and rotating a substrate, and an ultra pure water dispenser for dispensing ultra pure water onto a substrate mounted to the rotary chuck. The spin scrubbers of the processing unit 20 may also each include a brush to assist the ultra pure water in scrubbing contaminants from the surface of the substrate.

The transfer device 30 is disposed in the transfer space 40 between the index unit 10 and the processing unit 20. The transfer device 30 is supported so as to be linearly movable back and forth along a Y-axis in the transfer space 40. As will be described in further detail below, the transfer unit 30 also transfers the substrates between the index unit 10 and the processing unit 20.

The transfer device 30 includes a transfer block 33, and an index arm 31 and a transfer arm unit 32 supported on the transfer block 33. The transfer block 33 is engaged with a guide that extends in the direction of the Y-axis, and is connected to a driving mechanism so that the transfer block 33, the index arm 31 and the transfer arm unit 32 are movable all together along the Y-axis in the transfer space 40.

Figure 3:
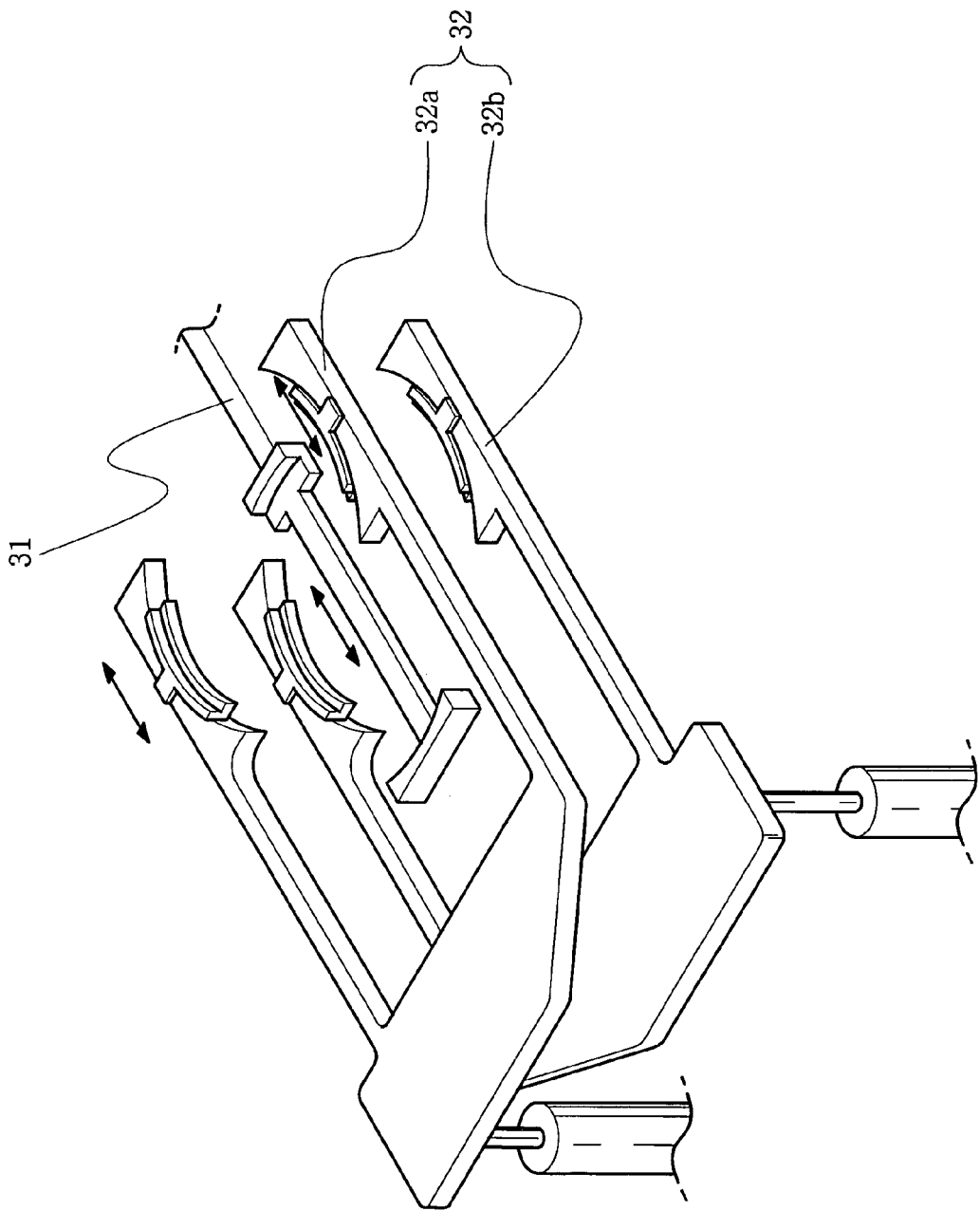
FIG. 3 is a perspective view of an index arm and a transfer arm unit of a substrate transfer device of the spin scrubber apparatus according to the present invention.

The index arm 31 and the transfer arm unit 32 face each other atop the transfer block 33 and are linearly and reciprocally movable toward and away from each other as shown in FIG. 3, along an axis perpendicular to the Y-axis. More specifically, the index arm 31 is supported at a side of the transfer block 33 adjacent the processing unit 20 so as to be linearly movable back and forth over a predetermined distance toward and away from the index unit 10 to load/unload substrates into/from the cassette 11 mounted on the index unit 10. On the other hand, the transfer arm unit 32 is supported at a side of the transfer block 33 adjacent the index unit 10 so as to be linearly movable back and forth over a predetermined distance toward and away the processing unit 20 to load/unload substrates into/from the processing unit 20. A passage through which the substrate is moved into and out of the processing unit 20 is located at a level higher than that at which the index arm 31 is disposed (see FIG. 4) to prevent the index arm 31 from interfering with the transfer arm unit 32 when the transfer arm unit 32 loads/unloads a substrate.

Figure 4:
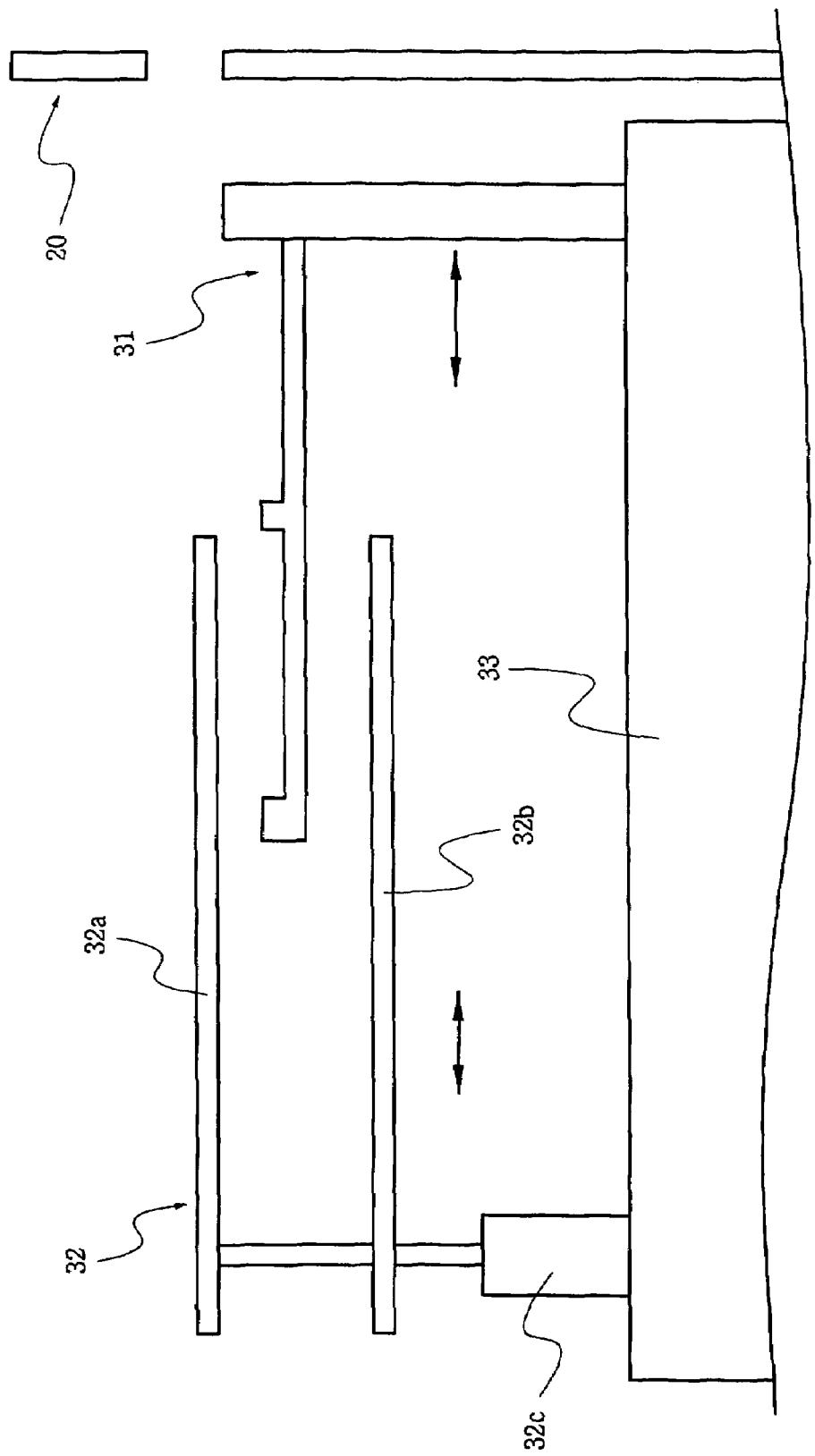
FIG. 4 is a side view of the substrate transfer device.

A substrate is transferred from the index arm 31 to the transfer arm unit 32 or from the transfer arm unit 32 to the index arm 31 by an up or down movement of the transfer arm unit 32. More specifically, the transfer arm unit 32 includes an upper arm 32a and a lower arm 32b disposed at different heights, as shown in FIG. 4, and movable up and down independently of one another.

The upper arm 32a and the lower arm 32b each include a pair of substrate support members that are spaced from one another by a distance greater than the outer diameter of the substrate, and substrate-holding portions facing each other at front ends of the support members, respectively. The substrate-holding portions each have a shape, e.g. of an arc, corresponding to that of a portion of the outer circumference of a substrate. The substrate-holding portions are spaced so as to align with and support respective outer circumferential portions of the substrate at opposite sides of the substrate.

Also, the transfer arm unit 32 includes vertical supports, such as cylinders 32c, for supporting the upper arm 32a and the lower arm 32b moving the arms 32a and 32b vertically. A fixed vertical support supports the index arm 31. The vertical supports and the rear ends of the upper and lower arms 32a and 32b are configured to prevent any interference in the vertical movements of the upper arm 32a and the lower arm 32b relative to one another and relative to the index arm 31. In particular, as best shown in FIG. 3, the rear end of the upper arm 32a includes an extension that projects laterally outwardly beyond one side of the lower arm 32b and likewise, the rear end of the lower arm 32b includes an extension that projects laterally outwardly beyond the opposite side of the upper arm 32a. The vertical supports, e.g., cylinders 32c, of the transfer arm unit 32 are connected to these extensions.

Figure 5:
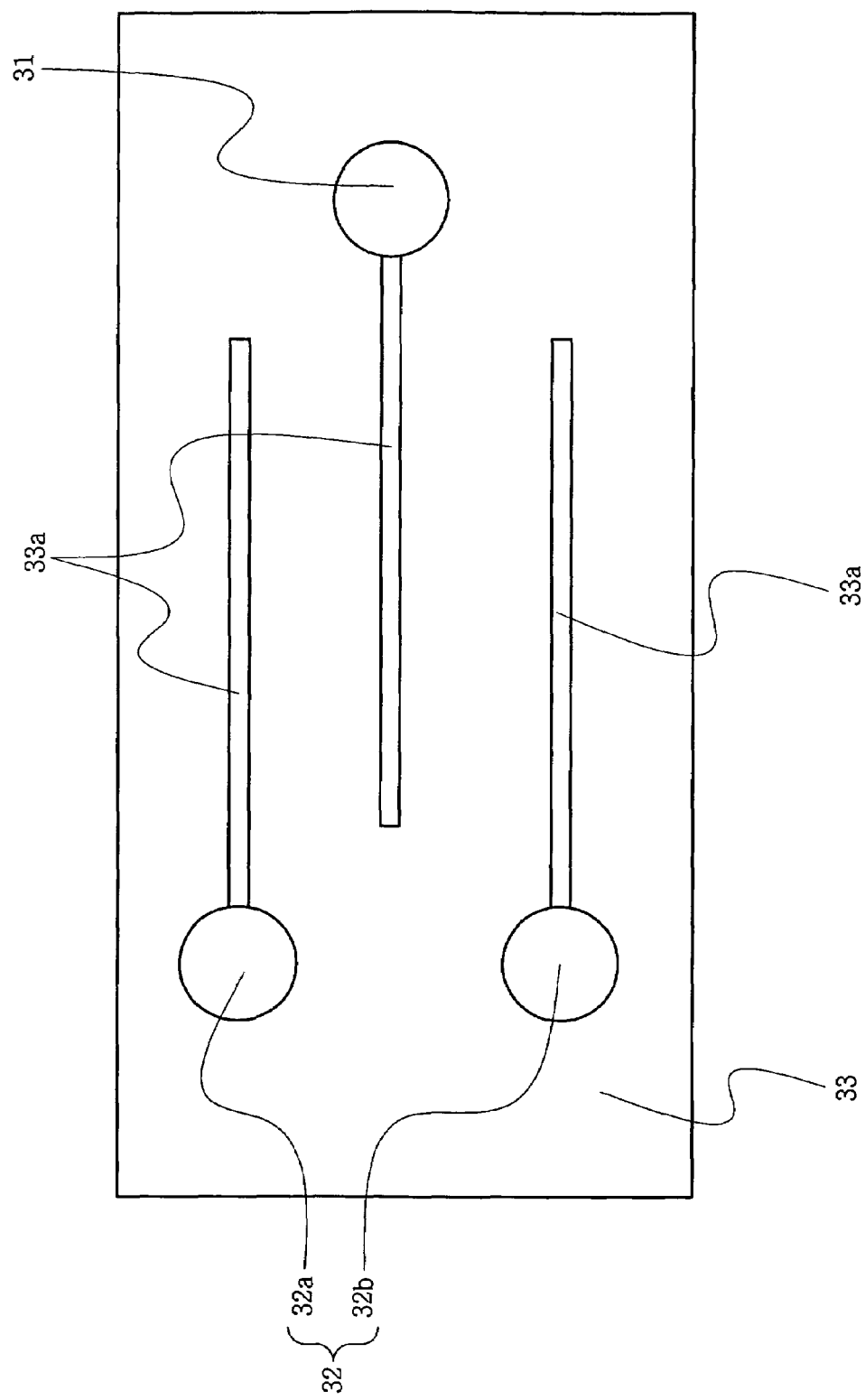
FIG. 5 is a plan of a transfer block and vertical supports of the substrate transfer device.

Referring now to FIG. 5, the transfer block 33 has a pair of guide slots 33a in which the vertical supports 32c of the transfer arm unit 32 are received and by which the upper arm 32a and the lower arm 32b and the index arm 31 are guided, respectively. The transfer block 33 also has a third guide slot 33a extending parallel to and between the aforementioned pair of guide slots 33a in which the vertical supports 32c of the transfer arm unit 32 are received. The vertical support of the index arm 31 is received in the third guide slot 33a and is guided thereby. The index arm 31 and the transfer arm 32 are moved back and forth along the guide slots 33a by linear drive mechanisms which are disposed under the transfer block 33 and are connected to the vertical supports of the index arm 31 and the transfer arm 32, respectively.

Figure 10A:
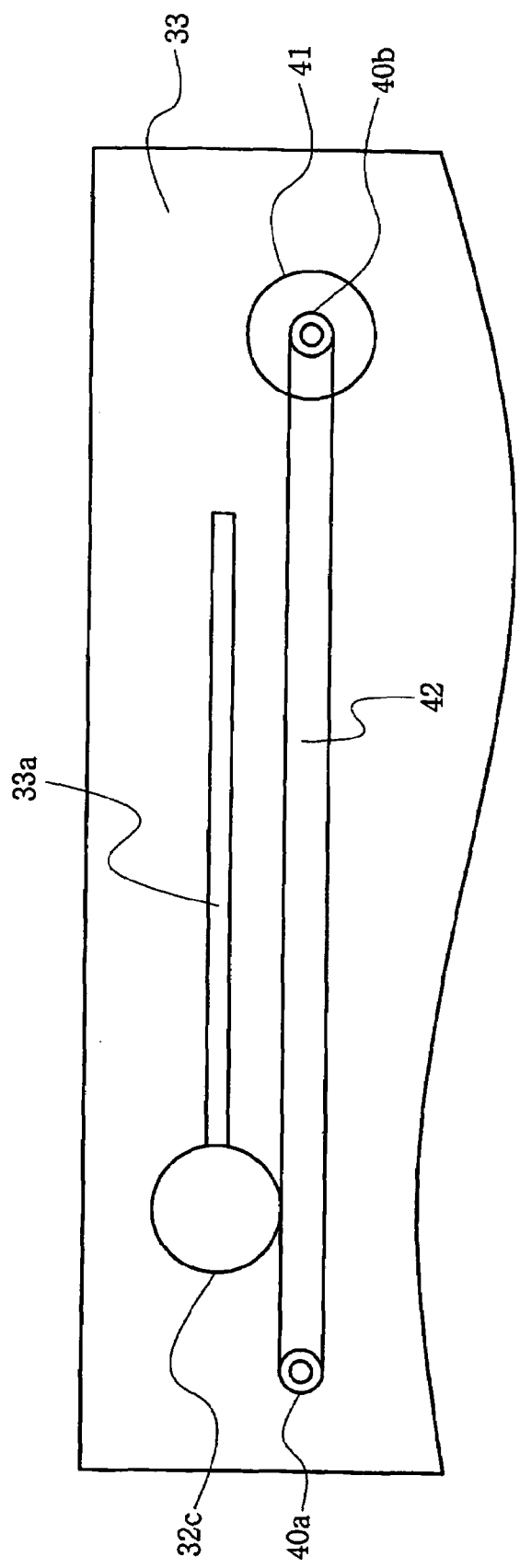
FIGS. 10A and 10B are each a bottom view of a portion of the substrate transfer device, illustrating different forms of a linear drive mechanism of the device.
Figure 10B:
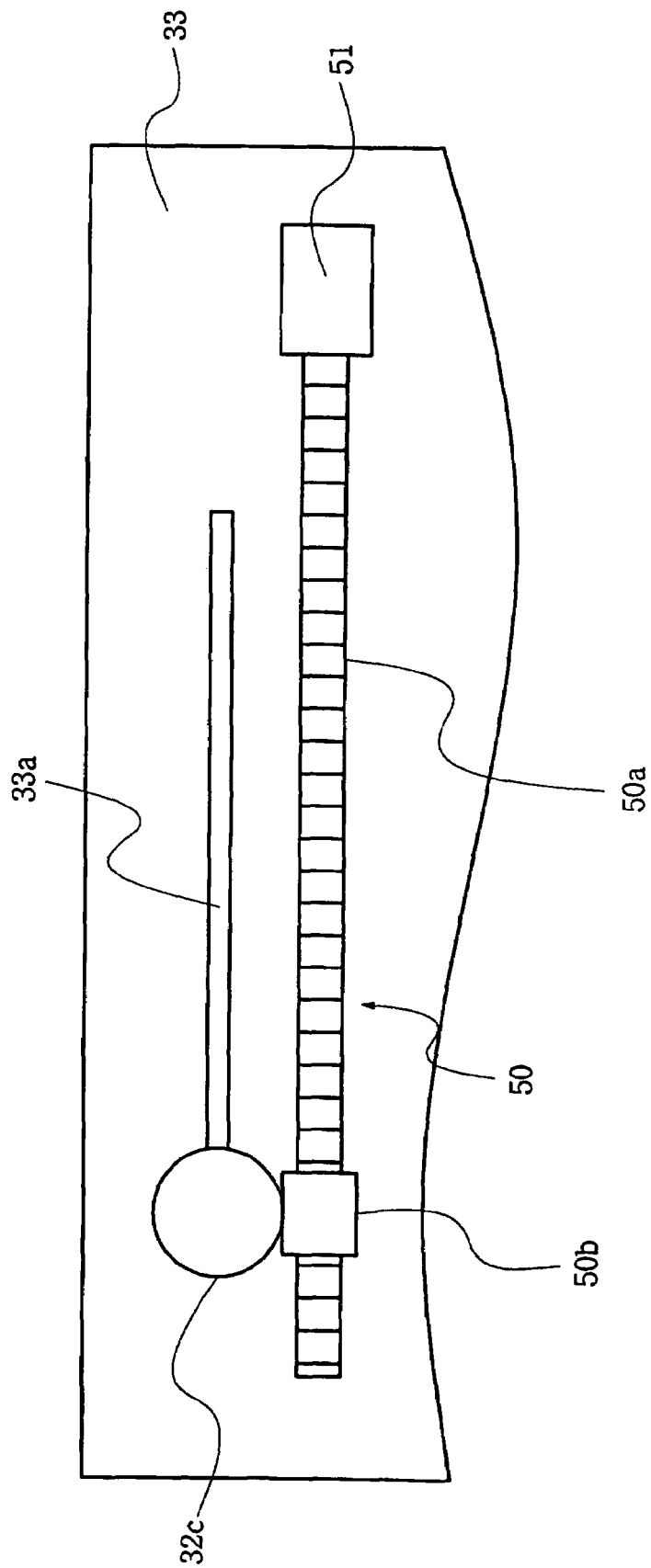

For example, as shown in FIG. 10A, the linear drive mechanism may include a pair of sprockets or pulleys 40a and 40b, a motor 41 having a rotary output shaft to which one of the sprockets or pulleys 40b is connected so as to be rotated by the motor 41, and a chain or a belt 42 extending around the pair of sprockets or pulleys 40a and 40b. One run of the chain or belt 42 is connected to the vertical support such that the vertical support is moved along with the belt 42 when the motor 41 is operating. Alternatively, as shown in FIG. 10B, the linear drive mechanism may include a ball screw 50 and a motor 51 for rotating the lead screw 50a of the ball screw. The vertical support is connected to the ball guide 50b of the ball screw so as to move linearly therewith along the lead screw 50a when the motor 51 rotates the lead screw 50a. Note, in FIGS. 10A and 10B, only one linear drive mechanism is shown as connected to a vertical support, e.g., to the vertical support 32c of the lower arm, for the sake of ease in illustration. However, similar linear drive mechanisms are provided for the upper arm 32a and the index arm 31.

The operation of the spin scrubber apparatus of the present invention will now be described in more detail.

Figure 6:
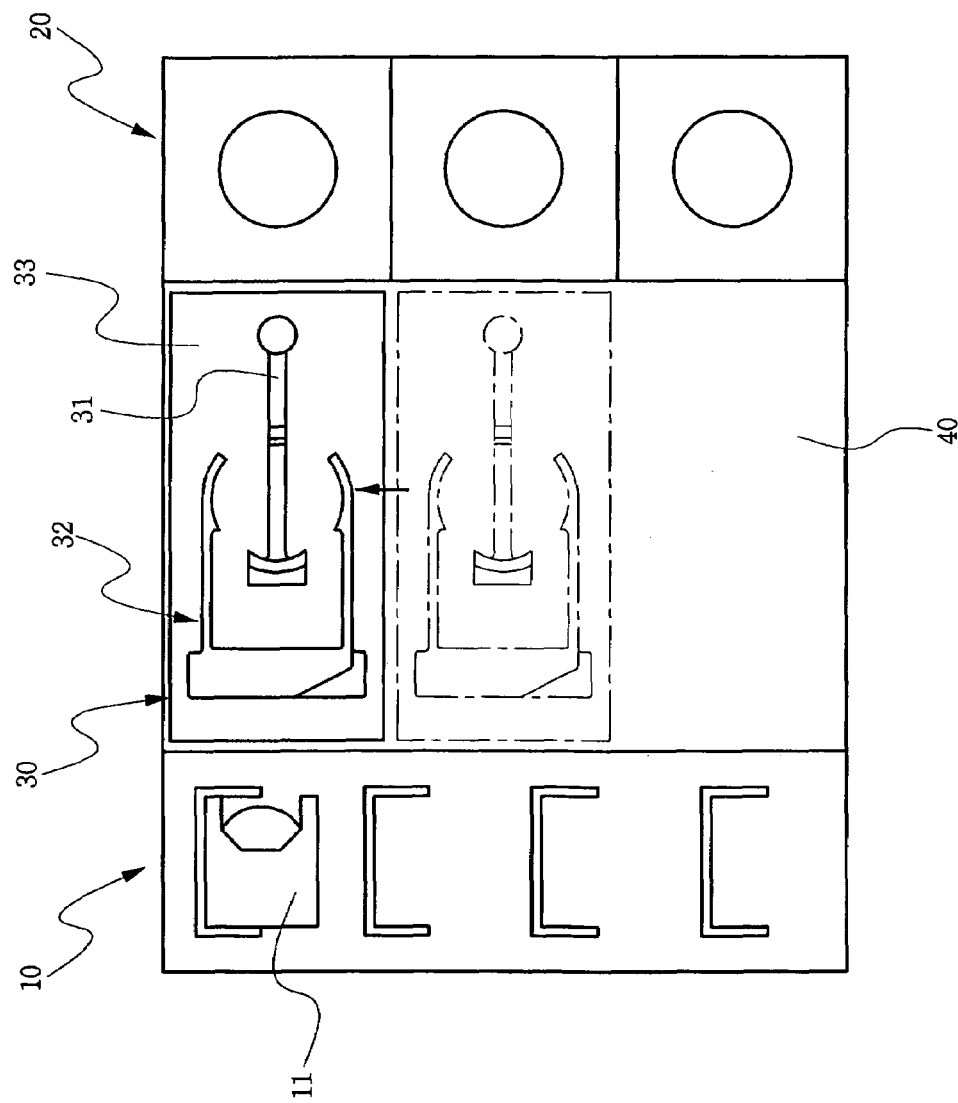
FIG. 6 is a plan view of the spin scrubber apparatus according to the present invention, illustrating the movement of a transfer block to the front of a cassette in which substrates to be cleaned are stacked.

A cassette 11 is mounted on the index unit 10 at a loading/unloading station thereof, and the transfer block 33 moves to an unloading position in front of the cassette 11, as shown in FIG. 6. Once the transfer block 33 is positioned in front of the cassette 11, the index arm 31 is moved horizontally on the transfer block 33 towards the cassette 11. Also, the index arm 31 is moved up or down before the index arm 31 enters the cassette 11 such that index arm 31 is located at a level between that of substrates disposed in the cassette. Only then is the index arm 31 moved into the cassette 11. Then the cassette 11 is moved downwardly so that the substrate W initially located above the index arm 31 is set down on and supported by the index arm 31. Subsequently, the index arm 31 is moved horizontally away from the index unit 10 to withdraw the substrate from the cassette 11.

Figure 7:
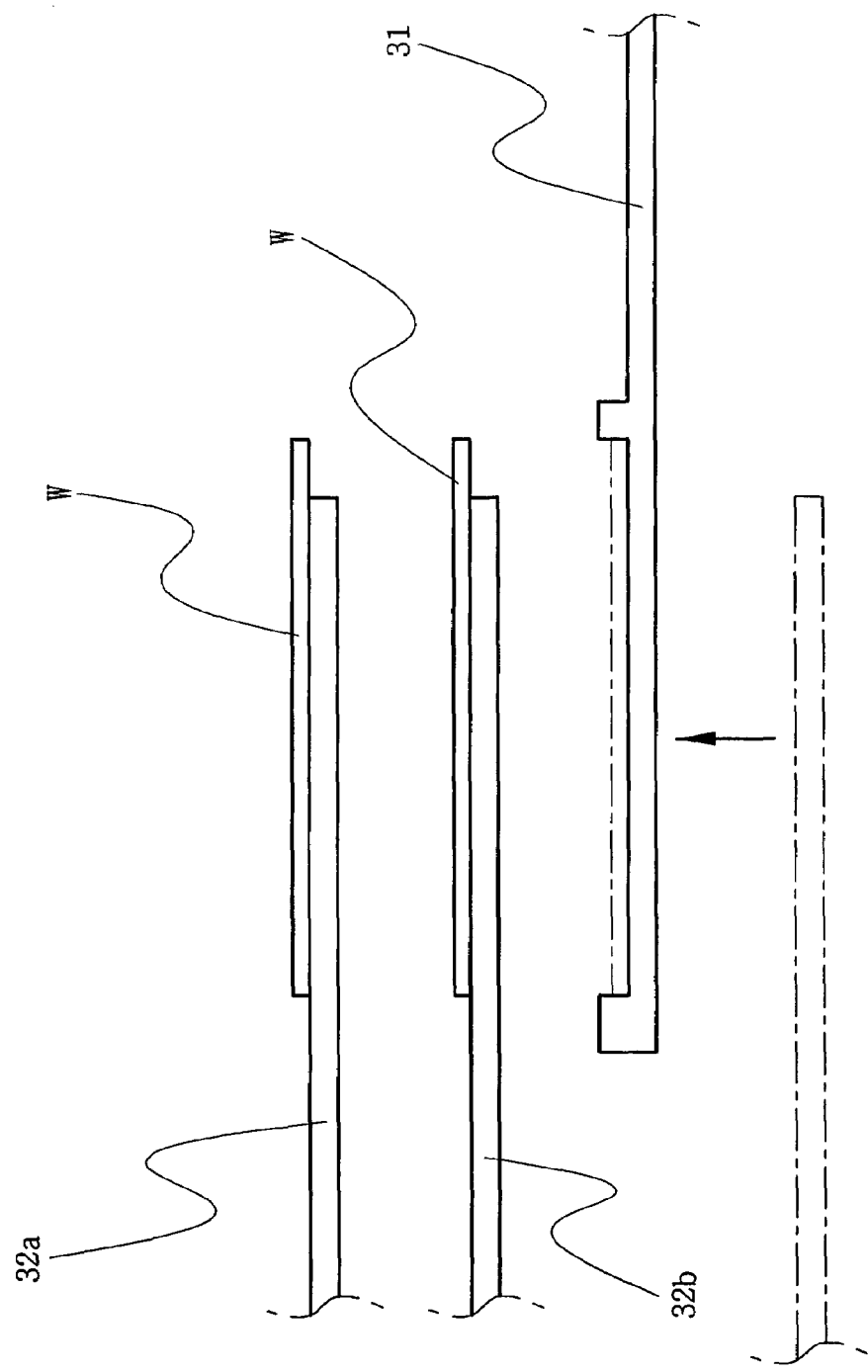

Next, the upper arm 32a of the transfer arm unit 32 withdraws a substrate that has been cleaned from a cleaning station of the processing unit 20. Once the substrate is withdrawn from the cleaning station of the processing unit 20 by the upper arm 32a, the lower arm 32b is moved upwardly above the index arm 31 so that the substrate W to be cleaned is transferred from the index arm 31 to the substrate-holding portions of the lower arm 32b, as shown in FIG. 7. Then the lower arm 32b transfers the substrate W to be cleaned to the inside of a cleaning station of the processing unit 20. The upper arm 32a is positioned above the lower arm 32b during this time so as not to interfere with the operation of the lower arm 32b.

Figure 8:
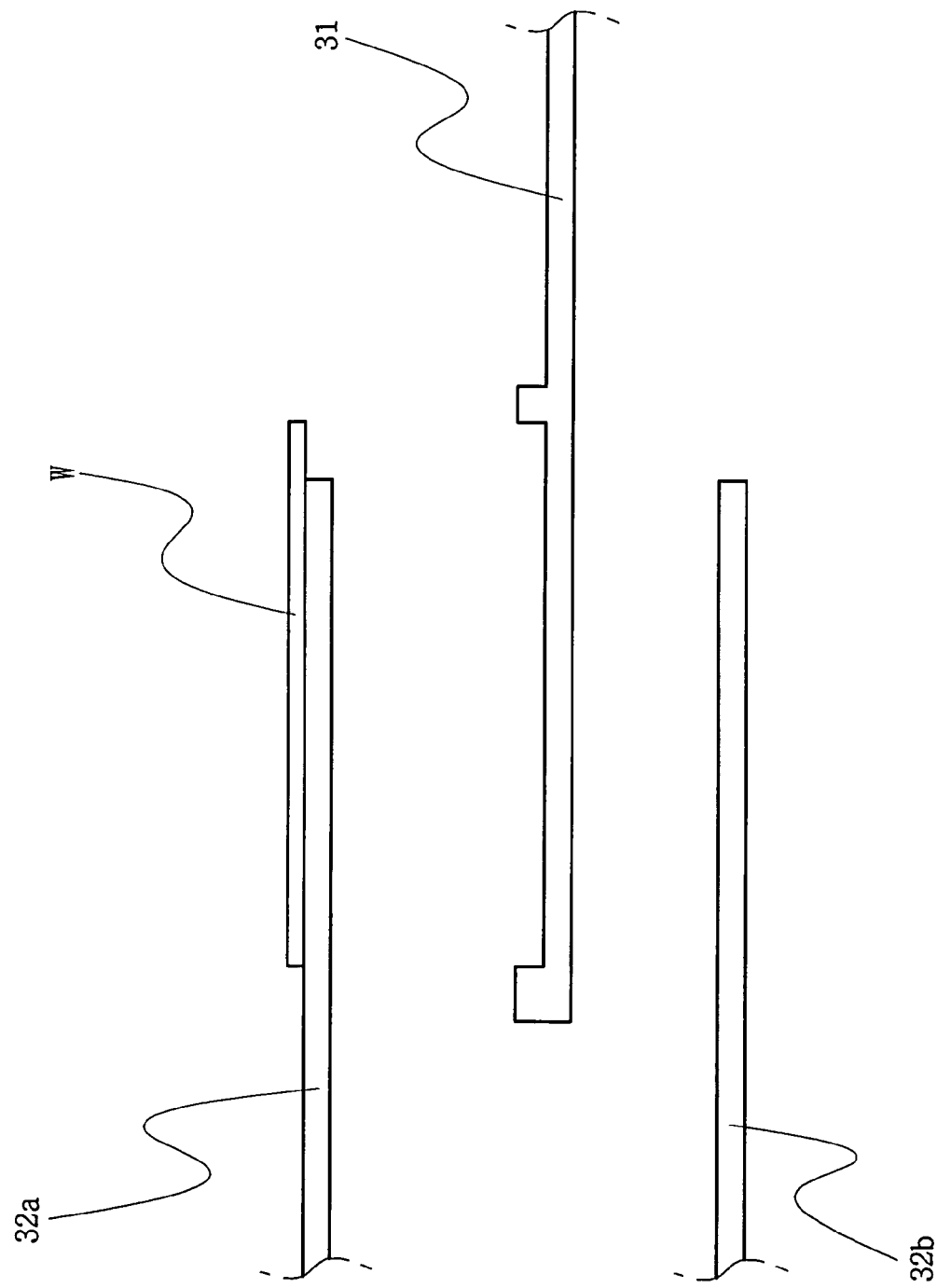

Next, the lower arm 32b is moved downwardly below the index arm 31, as shown in FIG. 8. Subsequently, the upper arm 32a is moved downwardly to transfer the cleaned substrate W to the index arm 31, as shown in FIG. 9. Once the cleaned substrate W is held by the index arm 31, the transfer block 33 may be moved in the direction of the Y-axis in the transfer path 40 so as to be positioned in front of a cassette 11 into which the cleaned substrate W is to be loaded. Alternatively, the cleaned substrate W may be transferred from the upper arm 32a of the transfer arm 32 to the index arm 31 once the transfer block 33 has arrived in front of the cassette 11 into which the substrate W is to be loaded. The upper arm 32a is moved back above the index arm 31 once the cleaned substrate W has been loaded by the index arm 31 into the cassette 11.

The above-described processes are repeatedly performed to clean all of the substrates in one or more cassettes 11.

As described above, according to the present invention, the index arm 31 and the transfer arm unit 32 a face each other on the transfer block 33, move together in the transfer space 40 along the Y-axis between one or more of the loading/unloading stations of the index unit 10 and the cleaning stations of the processing unit 20, and linearly move toward and away from each other within the same transfer space 40, to transfer substrates between the index unit 10 and the processing unit 20. Thus, the spin scrubber apparatus requires relatively little installation space. Furthermore, the path along which the substrate W is transferred by the index arm 31 and the transfer arm unit 32 within the common transfer space 40 is relatively short. Thus, the time required to complete the cleaning of one or more substrates W is correspondingly short.

Still further, the spin scrubber apparatus of the present invention is less costly to manufacture than the conventional spin scrubber apparatus because the index arm 31 and the transfer arm 32 are moved together by a single driving mechanism when the transfer device 30 is moved between a loading/unloading station of the index unit 10 and a cleaning station of the processing unit 20.

Finally, although the present invention has been described above in connection with the preferred embodiments thereof, it is to be understood that the scope of the invention is not limited to the disclosed embodiments. On the contrary, changes to and modifications of the preferred embodiments will be apparent to persons skilled in the art. And, such changes and modifications are seen to be within the true spirit and scope of the invention as defined by the appended claims.

What is claimed is:

1. A spin scrubber apparatus comprising:
an index unit having at least one loading/unloading station configured to support a cassette in which a plurality of substrates to be cleaned are stored;
a processing unit having at least one cleaning station at which a substrate is cleaned, the processing unit and the index unit facing each other across a transfer space, and at least one of the index unit and the processing unit having a plurality of the unloading/loading and cleaning stations, respectively;
a substrate transfer device disposed in the transfer space, the substrate transfer device including a transfer block, and an index arm and a transfer arm unit disposed on the transfer block,
the transfer block being supported so as to be linearly movable in the transfer space in the direction of a first axis such that the transfer block can be positioned in front of each said at least one loading/unloading station of the index unit and each said at least one cleaning station of the processing unit,
the index arm being supported by the transfer block so as to be movable between a transfer location in the transfer space and the index unit such that the index arm has a working envelope that encompasses the transfer location and the index unit, whereby the index arm loads/unload substrates into/from cassettes mounted to the index unit,
the transfer arm unit being supported by the transfer block so as to be movable between the transfer location in the transfer space and the processing unit such that the index arm has a working envelope that encompasses the transfer location and the processing unit,
whereby the transfer arm unit loads/unloads substrates into/from the processing unit, and wherein the working envelopes of the index arm and the transfer arm unit overlap at said transfer location in the transfer space, and
the index arm and the transfer unit being vertically moveable relative to each other, and
the index arm and the transfer unit being configured to be moveable vertically past each other when both the transfer arm unit and the index arm are positioned at said transfer location in the transfer space, such that substrates are transferable between the index arm and the transfer arm unit at the transfer location in the transfer space.

2. The apparatus according to claim 1, wherein the index unit includes an elevator such that cassettes mounted to the index unit are movable up and down.

3. The apparatus according to claim 1, wherein the transfer arm unit includes an upper arm and a lower arm.

4. The apparatus according to claim 3, wherein the upper arm and the lower arm are supported so as to be movable up and down independently of one another.

5. The apparatus according to claim 1, wherein the index arm and the transfer arm unit are aligned with each other along a second axis intersecting the index unit and the processing unit, and the index arm and the transfer arm unit are supported by the transfer block so as to be linearly movable toward and away from each other in the direction of the second axis, whereby the index arm has a stroke that encompasses said transfer location and the index unit, and the transfer arm unit has a stroke that encompasses said transfer location and the processing unit.

6. The apparatus according to claim 5, wherein the transfer arm unit includes an upper arm and a lower arm which are each linearly movable back and forth in the direction of the second axis.

7. The apparatus according to claim 6, wherein the transfer block has three guide slots extending therein in the direction of a second axis, the transfer arm unit further includes vertical supports that support the upper arm and the lower arm and are received in two of the guide slots, respectively, and a vertical support that supports the index arm and is received in a third one of the guide slots, the third one of the guide slots being disposed between said two of the guide slots.

8. The apparatus according to claim 6, wherein the arm unit further comprises vertical supports that support the upper and lower arms, respectively, so as to be movable up and down above the transfer block independently of one another.

9. The apparatus according to claim 6, wherein the upper arm includes an extension that projects laterally outwardly beyond one side of the lower arm, and the lower arm includes an extension that projects laterally outwardly beyond the opposite side of the upper arm, and the arm unit further comprises vertical supports supporting the upper and lower arms at the extensions thereof, respectively.

10. The apparatus according to claim 9, wherein the vertical supports comprise cylinders by which the upper and lower arms are movable up and down.

11. The apparatus according to claim 5, wherein transfer device further comprises a linear drive mechanism operatively connected to each of the index arm and the transfer arm unit, respectively, to move the index arm and the transfer arm unit linearly back and forth in the direction of the second axis.

12. The apparatus according to claim 11, wherein the linear drive mechanism comprises a pair of sprockets or pulleys mounted to and rotatably supported by the transfer block at opposite sides thereof, a chain or belt extending around the pair of sprockets or pulleys, and a motor connected to one of the sprockets or pulleys so as to rotate said one of the sprockets or pulleys.

13. The apparatus according to claim 11, wherein the linear drive mechanism comprises a ball screw.

14. The apparatus of claim 11, wherein the linear drive mechanism operatively connected to the index arm has a member that is reciprocatable in the direction of the second axis and to which the index arm is directly attached so as to reciprocate therewith, and the linear drive mechanism operatively connected to the transfer arm unit has a member that is reciprocatable in the direction of the second axis and to which the transfer arm unit is directly attached so as to reciprocate therewith.

15. The apparatus according to claim 1, wherein the transfer arm unit is supported so as to be movable up and down above the transfer block, the index arm is supported so as to be fixed at a predetermined height above the transfer block, and each said at least one cleaning station of the processing unit defines a passageway through which substrates are withdrawn from and inserted into the station, the passageway being located at a level in the apparatus that is different from the level at which the index arm is fixed, whereby the index arm does not interfere with the loading/unloading of substrates into/from the processing unit by the transfer arm.

16. The apparatus according to claim 1, wherein the index unit has a plurality of the index stations arrayed in the direction of the first axis.

17. The apparatus of claim 5, wherein the transfer block has guides extending linearly in the direction of the second axis, the index arm and the transfer arm unit being received within the guides, respectively.

18. The apparatus of claim 17, wherein the guides are slots in the transfer block.

19. The apparatus according to claim 1, wherein the processing unit has a plurality of the cleaning stations arrayed in the direction of the first axis.

20. The apparatus according to claim 1, wherein the index unit has a plurality of the index stations arrayed in the direction of the first axis, and the processing unit has a plurality of the cleaning stations arrayed in the direction of the first axis.

* * * * *